United States Patent

Ochiai et al.

[19]

[11] Patent Number: 6,058,057
[45] Date of Patent: May 2, 2000

[54] TIMING GENERATOR FOR SEMICONDUCTOR TEST SYSTEM

[75] Inventors: Katsumi Ochiai; Toshiaki Misono, both of Gyoda, Japan

[73] Assignee: Advantest Corp., Tokyo, Japan

[21] Appl. No.: 09/289,201

[22] Filed: Apr. 9, 1999

[30] Foreign Application Priority Data

Apr. 17, 1998 [JP] Japan .................................. 10-107661

[51] Int. Cl.[7] ...................................................... G11C 7/00
[52] U.S. Cl. ............................................ 365/201; 365/233
[58] Field of Search ..................................... 365/201, 233, 365/237; 327/107, 100, 117; 326/93, 96

[56] References Cited

U.S. PATENT DOCUMENTS

5,291,449 3/1994 Dehara ..................................... 365/201

*Primary Examiner*—Vu A. Le
*Attorney, Agent, or Firm*—Muramatsu & Associates

[57] ABSTRACT

A timing generator for a semiconductor test system having an interleave architecture with no interleave jitters. The timing generator includes a plurality of timing data generators arranged in a parallel fashion and provided with a first clock signal in which each of the timing data generator produces a coarse timing signal and a delay time data based on timing data provided by a test program, a multiplexer provided with a second clock signal having a frequency higher than the first clock signal for receiving the coarse timing signals and delay data in parallel and produces selected one of coarse timing signal and the delay data in series, and a variable delay circuit which receives the coarse timing signal and the delay data from the multiplexer for providing a delay time defined by the delay data to the coarse timing signal.

20 Claims, 8 Drawing Sheets

TIMING GENERATOR FOR SEMICONDUCTOR TEST SYSTEM

FIELD OF THE INVENTION

This invention relates to a timing generator to be used in a semiconductor test system, and more particularly, to a timing generator for a semiconductor test system having an interleave architecture which is capable of improving timing accuracy in producing pulse signals of predetermined delay times using a variable delay circuit therein.

BACKGROUND OF THE INVENTION

In testing semiconductor devices such as ICs and LSIs by a semiconductor test system, such as an IC tester, a semiconductor IC device to be tested is provided with test signals produced by a semiconductor test system at its appropriate pins at predetermined test timings. The test system receives output signals from the IC device under test generated in response to the test signals. The output signals are strobed, i.e., sampled, by strobe signals with predetermined timings to be compared with expected data to determine whether the IC device functions correctly.

Timings of the test signals and strobe signals are defined, for example, relative to a tester rate or a tester cycle of the semiconductor test system. In a such a semiconductor test system, the semiconductor device under test (DUT) is tested by providing a cycled pin pattern vectors at a programmed data rate (tester cycle) to a formatter with timing edges to produce the desired waveforms of the test signals and the strobe signals.

Generally, the various timings of the tester cycles, test signals and strobe signals are generated based on a clock signal such as a reference clock or system clock. The reference clock is produced by a high stability oscillator, for example, a crystal oscillator provided in the IC tester. When the required timing resolution in an test system is equal to or an integer multiple of the highest clock rate (shortest clock cycle) of the reference clock oscillator, variety of timing signals can be generated by simply dividing the reference clock by a counter or a divider.

However, semiconductor test systems are usually required to have timing resolution higher than the highest clock rate, i.e., the shortest time period, of the reference (system) clock. For example, in the case where a reference clock used in an IC tester is 10 ns (nanosecond), but the IC tester needs to have timing resolution of 0.3 ns or higher, it is not possible to achieve such timing resolution by simply applying or dividing the reference clock. Thus, a timing generator for generating high resolution timing signals includes a fine variable delay circuit which is able to produce a delay time smaller than a time length of one clock cycle in response to timing data provided thereto.

Moreover, in order to generate timing signals of high frequency repetition rate without using very high speed circuit components, a timing generator may have an interleave architecture. In an interleave based timing generator, a plurality of timing generation circuits are incorporated in a parallel fashion. The output signals of such timing generation circuits are combined to produce signals in a series fashion so that the resultant timing signals have a high repetition rate even though a timing signal in each of the parallel circuits has a relatively low frequency.

Figure 5A:
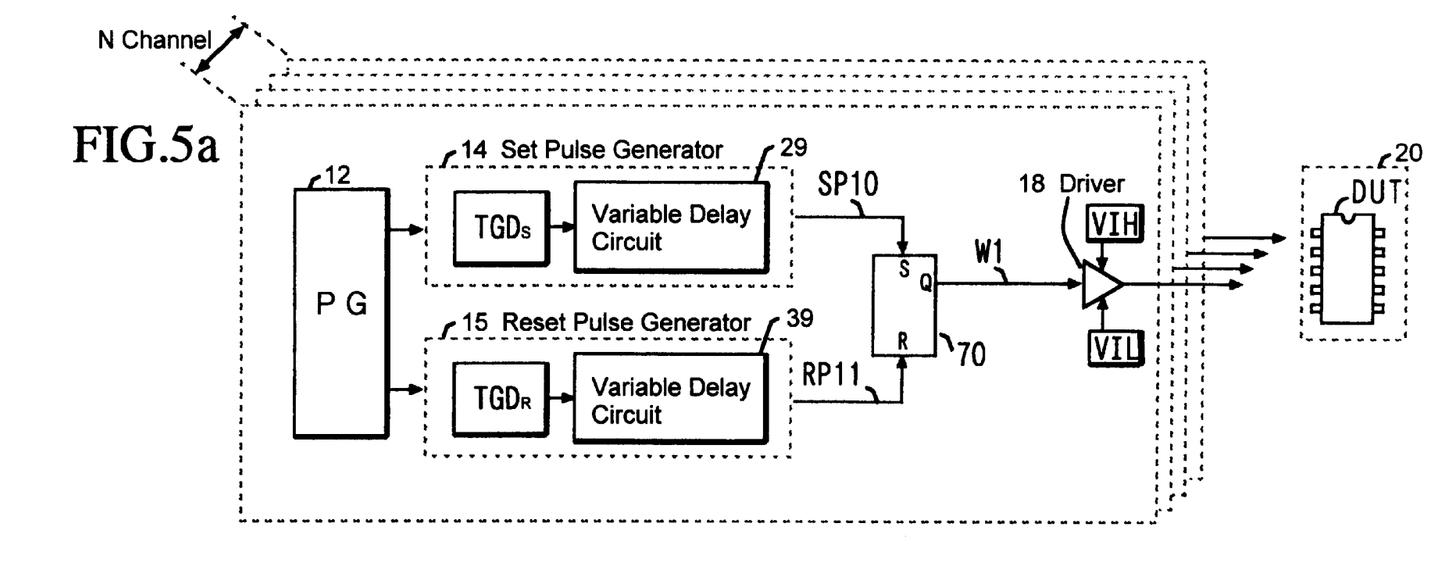
FIG. 5 is a schematic diagram showing a basic structure of a semiconductor test system of an interleave architecture in the conventional technology.
Figure 5B:
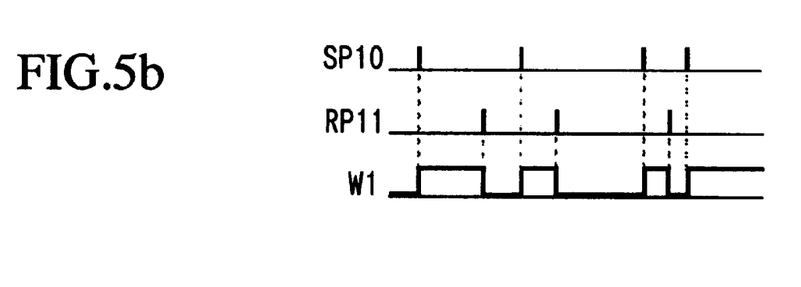

The conventional semiconductor test system having such an interleave based timing generator having fine variable delay circuits is described with reference to FIGS. 5–7. FIG. 5a is a schematic diagram showing a basic structure of the conventional semiconductor test system and FIG. 5b shows waveforms for producing a test signal to be supplied to a device under test (DUT).

In the example of FIG. 5a, the semiconductor test system includes a pattern generator 12, a set pulse generator 14 having a timing data generator $TGD_S$ and a variable delay circuit 29, a reset pulse generator 15 having a timing data generator $TGD_R$ and a variable delay circuit 39, a flip-flop 70 which is typically a set-reset flip-flop, and a driver 18. Based on the foregoing arrangement, the output of the driver 18 provides a test signal to a terminal pin of a device under test (DUT) 20.

As is known in the art, a high end semiconductor test system has a per-pin architecture in which test signals of desired timings can be generated by each tester pin (test channel) independently from the other tester pins. In other words, each of the tester pins includes the pattern generator 12, the set pulse generator 14, the reset pulse generator 15, the flip-flop 70 and the driver 18. The number of tester pins must be sufficient to the number of terminal pins of anticipated devices to be tested, which may be as many as several hundreds to one thousand. For the simplicity of explanation, in the present invention, only one of such tester pins is described although there are many tester pins in the actual test system.

In the example of FIG. 5a, the pattern generator 12 generates test pattern signals with a wave shaped manner which is provided to the set pulse generator 14 and the reset pulse generator 15. The pattern generator 12 also provides timing information to the set pulse generator 14 and the reset pulse generator 15 as will be described with reference to FIG. 6. The set pulse generator 14 and the reset pulse generator 15 have identical structure to one another. As shown in FIG. 5b, when receiving the test pattern signal from the pattern generator 12, the set pulse generator 14 outputs a set pulse signal SP10 having a predetermined delay timing. Similarly, the reset pulse generator 15 outputs a reset pulse signal RP11 having a predetermined delay timing. Upon receiving both the set pulse and reset pulse mentioned above, the flip-flop 70 generates a test wave W1 to be applied to the DUT 20 via the driver 18.

The more specific configuration of the set pulse generator 14 is explained with reference to FIG. 6. As noted above, the reset pulse generator 15 has substantially the same configuration as that of the set pulse generator 14. Here, the number of phase L in the interleave architecture is four, i.e., four timing signals are processed in parallel and combined together to form a series timing signal. Depending on the test speed desired, the interleave architecture may be configured to have different number of phases such as two phases, eight phases or more.

Figure 6:
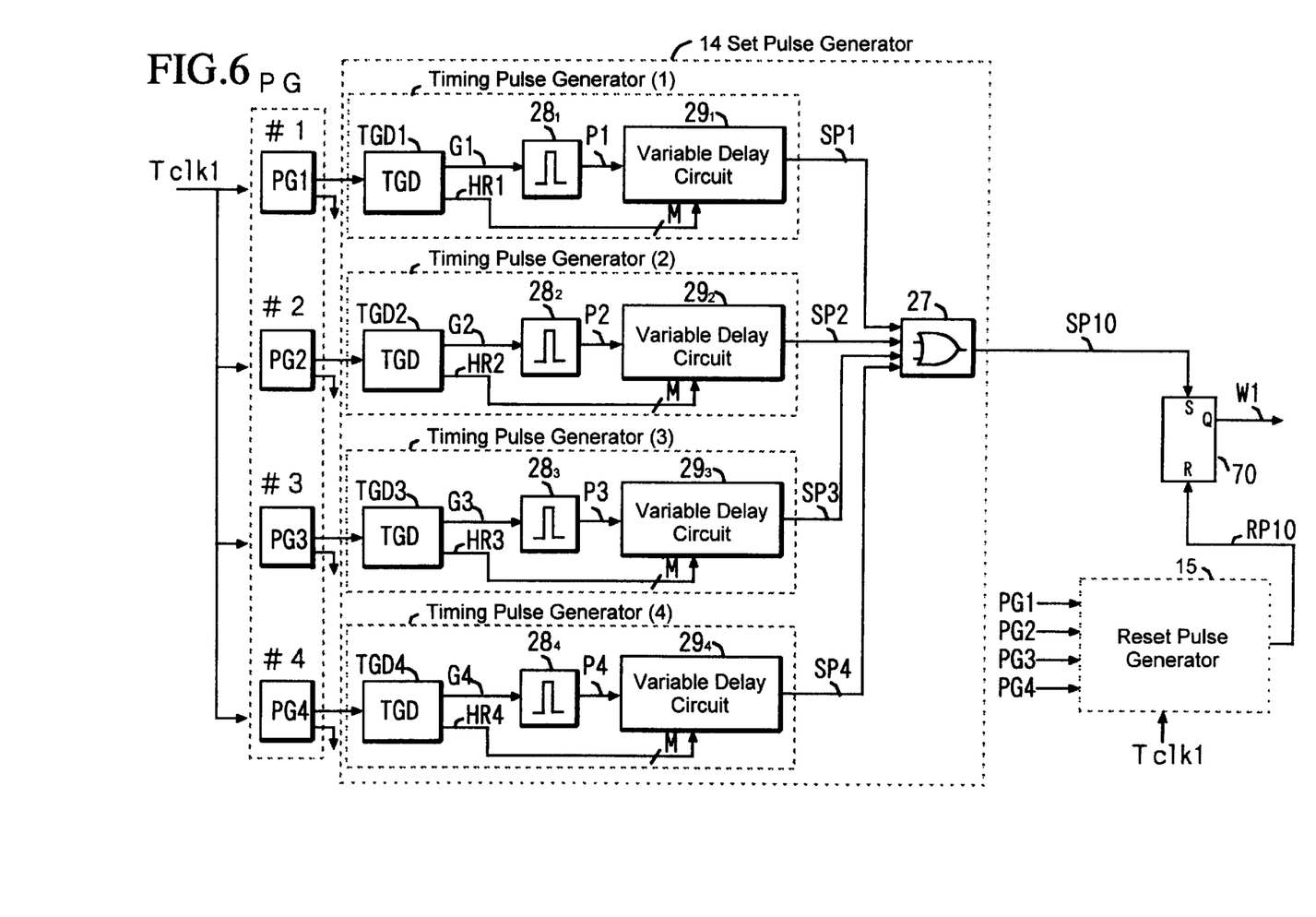
FIG. 6 is a block diagram showing an configuration of the conventional timing generator in the example FIG. 5 having the interleave structure.

In the example of FIG. 6, since the number of phase L=4 and high speed test signals having a frequency of four times higher than the signals processed in each of the parallel circuit can be generated. For example, when the maximum test frequency (test rate) is 500 MHz, the frequency of 125 MHz, that is one-fourth of the maximum frequency, can be handled by the parallel circuits. Thus, low frequency circuits can generate a high frequency signal although the number of circuit components must be increased.

In FIG. 6, the set pulse generator 14 includes timing pulse generators (1)–(4). The outputs of the timing pulse generators (1)–(4) are connected to an OR circuit 27 wherein they are combined to produce a series signal (set pulse SP10) which is supplied to the set terminal of the flip-flop 70. Each of the timing pulse generators (1)–(4) includes a timing data generator TGD, a pulser 28 and a variable delay circuit 29. The pattern generator PG1–PG4 produces, among others, timing information based on a test program to produce test waves to be supplied to the device under test. The pattern generators PG1–PG4 may also have an interleave structure so that each pattern generator PG provides the set pulse timing information to the corresponding timing data generator TGD in response to a test clock $T_{clk1}$.

In the timing pulse generator (1), upon receiving the set pulse timing information from the pattern generator PG1, the timing data generator TGD1 generates a coarse set signal G1 which may be delayed from the previous set signal by an integer multiple of the test clock $T_{clk1}$. The repetition rate of the coarse set signal G1 defines a tester rate of the current test cycle in the test system. The timing data generator TGD also generates high resolution delay data HR1 having an M-bit width. The size of the M-bit width differs depending on the delay accuracy of the test system, and is configured by, for example, 10 bits.

Upon receiving the coarse set signal G1 from the timing data generator TGD1, the pulser 28 outputs a pulse signal P1 in synchronism with the signal G1 having a predetermined pulse width. The pulse signal P1 is provided to the variable delay circuit $29_1$ wherein a high resolution delay time smaller than the test clock cycle is added.

Figure 7A:
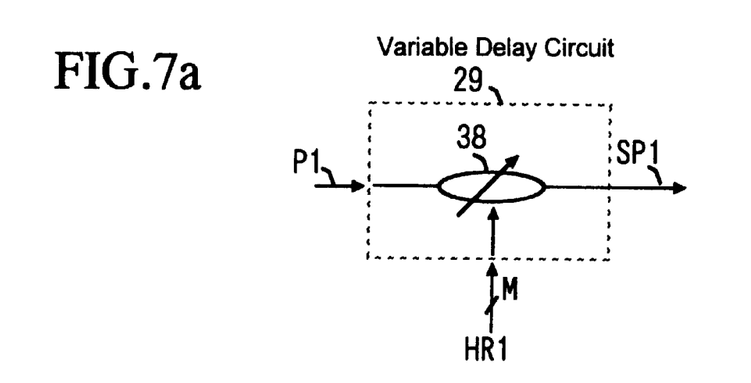

As shown in FIG. 7a, a basic form of the variable delay circuit 29 is an analog type fine variable delay circuit 38. The maximum delay time of which is, for example, one cycle length of the test clock $T_{clk1}$ such as eight 8 nS (nanosecond). Typically, such a variable delay circuit is formed of a large number of series connected semiconductor components, such as CMOS gates whose signal propagation delay times are regulated by changing the voltages supplied thereto. Such a variable delay circuit is well known in the art and is frequently used in a semiconductor test system for producing timing signals of high resolution.

Upon receiving the high resolution delay data HR1 from the timing data generator TGD1, the variable delay circuit $29_1$ adds a high resolution delay time defined by the data HR1 to the pulse signal P1. The timing resolution of the variable delay circuit $29_1$ is, for example, in the order of several ten picoseconds. Thus, a set pulse signal SP1 having a high resolution delay time is produced by the variable delay circuit $29_1$ and is provided to the input of the OR circuit 27. This set pulse signal SP1 defines a rising edge of the test signal W1 to the DUT 20.

In the similar manner, the timing pulse generators (2), (3) and (4) respectively provide set pulse signals SP2, SP3 and SP4 to the OR circuit 27. Thus, the OR gate 27 receives four pulse signals in parallel and outputs the set pulse signal SP10 that is a logical sum of the four pulse signals. In other words, the set pulse generator 14 functions as a parallel to serial converter.

The flip-flop 70 is a set/reset type flip-flop, such as an RS flip-flop. The flip-flop 70 receives the set pulse signal SP10 from the set pulse generator 14 at the set terminal, thereby setting the output to a high level. Similarly, the flip-flop 70 receives the reset pulse signal RP11 from the reset pulse generator 15 at the reset terminal, thereby setting the output to a low level. Accordingly, the flip-flop 70 generates the test wave W1 having a rising edge defined by the set pulse signal and a falling edge defined by the reset pulse signal. The test wave W1 is supplied to the DUT 20 through the driver 18.

In the conventional technology, the timing generator described above has a drawback in terms of timing accuracy when generating the test wave W1. The timing accuracy problem arises in the parallel structure of the variable delay circuits $29_1$–$29_4$. As in the foregoing, the variable delay circuit 29 is provided in each of the four phases of the interleave configuration and is alternately selected to produce a series signal. Thus, the variable delay circuit 29 generates the set pulse signal SP1–SP4 (or reset pulse RP1–RP4) with the predetermined timings.

As noted above, variable delay circuits 29 are typically configured by series connected delay elements, typically CMOS gates, whose delay times are usually different from one another. Further, the delay times of the CMOS gates show different characteristics in response to the changes of the ambient temperature. Because such differences in the delay elements, each variable delay circuit 29 for each phase is not exactly identical to the other. As a result, each of the set pulse signals SP1–SP4 from the variable delay circuit is fluctuated differently from the other.

Figure 7B:
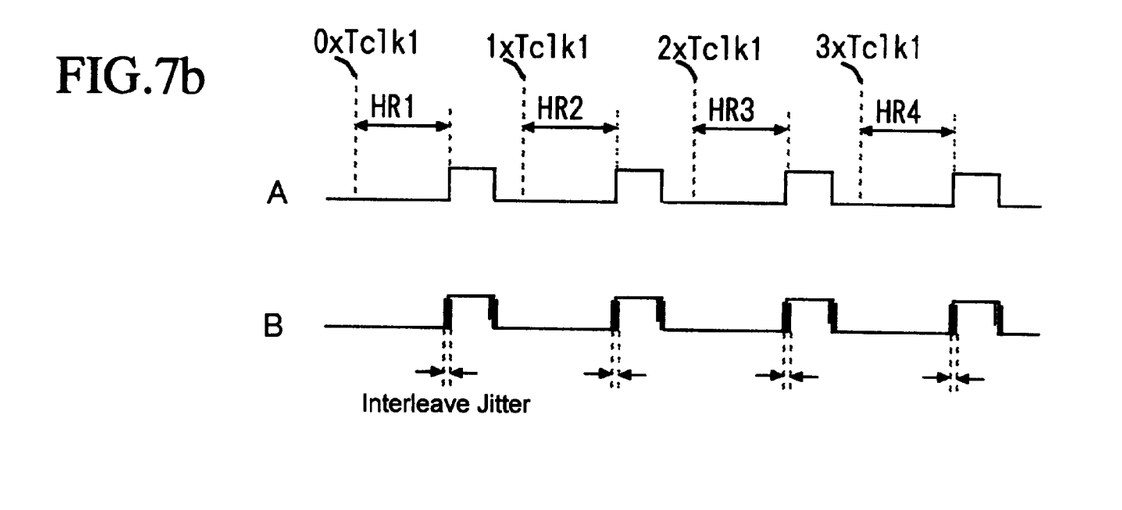

As a consequence, for the timing relationship A of FIG. 7b, the set pulse signals as shown by a reference label B of FIG. 7b are resulted which has relative timing fluctuations, i.e., interleave (phase) jitters. Typically, the maximum jitter in such a situation is equivalent to two times of the maximum timing resolution. Therefore, if the maximum timing resolution of the intended timing generator is 50 picoseconds, the maximum jitter of 100 picoseconds can be attached to the set pulse signals. The similar jitters are produced in the reset pulse signals as well in the similar manner. In addition, because the variable delay circuits have different temperature characteristics as noted above, the relative delay times among the set pulses and among the resent pulses will be fluctuated when interleaved according to the change of the temperature.

Thus, the conventional timing generator is undesirable because interleave jitters and relative timing fluctuations are involved in the test wave to be applied to the DUT. Since the timing accuracy in the semiconductor test system is one of the most important factors, the interleave jitters and relative timing fluctuations are serious drawbacks in the semiconductor testing. Moreover, provision of the variable delay circuit at each phase of the interleave architecture increases the size and circuit components of the semiconductor test system.

SUMMARY OF THE INVENTION

It is therefore an object of the present invention to provide a semiconductor test system that can further improve the timing accuracy of the delay pulse signal wherein delay pulse signal is generated in the interleave configuration.

It is another object of the present invention to provide a semiconductor test system having a timing generator of an interleave architecture which will not cause timing fluctuations or jitters in the delay pulse signal.

It is a further object of the present invention to provide a semiconductor test system having a timing generator of an interleave architecture in which the timing accuracy is less susceptible to the ambient temperature change.

It is a further object of the present invention to provide semiconductor test system having a timing generator of an interleave architecture which is capable of reducing the number of circuit components and cost.

In the semiconductor test system of the present invention, the interleave operation is performed by a logic circuit wherein the signals therein are synchronized with the high speed clock and a variable delay circuit provides a high resolution delay time to the signals from the logic circuit.

Thus, there is no interleave operation in the variable delay circuit, resulting in no interleave jitter.

In one aspect of the present invention, the timing generator for a semiconductor test system includes a plurality of timing data generators arranged in a parallel fashion and provided with a first clock signal in which each of the timing data generator produces a coarse timing signal and a delay time data based on timing data provided by a test program, multiplexing means provided with a second clock signal having a frequency higher than the first clock signal for receiving the coarse timing signals and delay data in parallel and produces selected one of coarse timing signal and the delay data in series, and a variable delay circuit which receives the coarse timing signal and the delay data from the multiplexing means for providing a delay time defined by the delay data to the coarse timing signal.

In the second aspect of the present invention a semiconductor test system for testing a semiconductor device by supplying test signals with predetermined timings to a semiconductor device under test (DUT) includes: a pattern generator for generating a test pattern signal and timing information of the test pattern signal based on a test program, a set pulse generator for generating a set pulse which defines a rising edge of the test pattern signal to be supplied to the DUT, a reset pulse generator for generating a reset pulse which defines a falling edge of the test pattern signal to be supplied to the DUT, a flip-flop circuit for producing the test pattern signal having the rising edge defined by the set pulse from the set pulse generator and the falling edge defined by the reset pulse from the reset pulse generator, wherein each of the set pulse generator and the reset pulse generator comprising: a plurality of timing data generators arranged in a parallel fashion and provided with a first clock signal in which each of the timing data generator produces a coarse timing signal and a delay time data based on the timing information provided by the test program, multiplexing means provided with a second clock signal having a frequency higher than the first clock signal for receiving the coarse timing signals and delay data in parallel and produces selected one of coarse timing signal and the delay data in series, and a variable delay circuit which receives the coarse timing signal and the delay data from the multiplexing means for providing a delay time defined by the delay data to the coarse timing signal.

Further in the present invention, the variable delay circuit is comprised of a logic delay circuit for delaying the coarse timing signal by an integer multiple of one cycle length of the second clock signal, and an analog delay circuit connected in series with the logic delay circuit for delaying the coarse timing signal by a time length which is a fraction of one cycle length of the second clock signal based on the delay data received from the multiplexing means.

The logic delay circuit is formed with series connected flip-flop circuits and a multiplexer which receives outputs of the flip-flop circuits and selects one of the outputs, and the analog delay circuit is formed with a plurality of CMOS gates series connected with one another.

According to the present invention, since there is no interleave operation in the variable delay circuits, the interleave jitter involved in the conventional technology when interleaving pulse signals in the variable delay circuits is no longer occurred. Further, since only one variable delay circuit is employed, the circuit components and the circuit size can be substantially decreased. Moreover, since the variable delay circuit is assigned to the high resolution delay time which is smaller than that of the conventional example, the delay time fluctuation by the temperature change is also substantially reduced.

BRIEF DESCRIPTION OF THE DRAWINGS

FIG. 2a is a block diagram showing an example of a variable delay circuit for the timing generator of the present invention and FIG. 2b is a timing chart showing an operation of the variable delay circuit of FIG. 2a.

FIG. 3 is a timing chart showing an operation of the semiconductor test system of FIG. 1 and the variable delay circuit of FIG. 2a.

FIG. 7a is a schematic diagram showing a basic structure of a variable delay circuit for the conventional timing generator and FIG. 7b is a timing chart showing an operation of the variable delay circuit of FIG. 7a.

DESCRIPTION OF THE PREFERRED EMBODIMENTS

The embodiments of the present invention will be explained with reference to the drawings. The first embodiment of the present invention is explained with reference to FIGS. 1–4.

Figure 1:
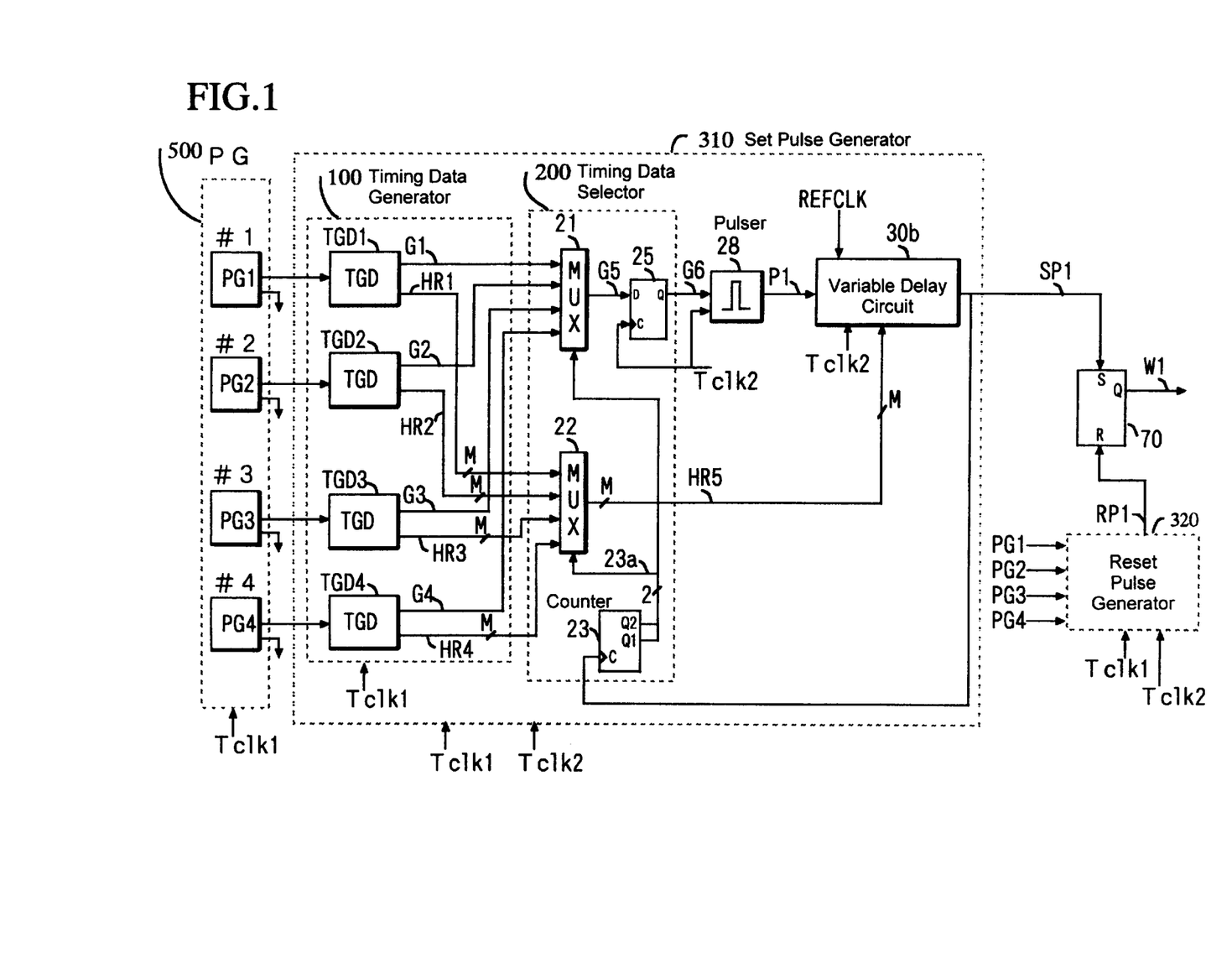
FIG. 1 is a block diagram showing an example of configuration of a timing generator in the semiconductor tests system of the present invention having a four-phase interleave architecture.

The block diagram of FIG. 1 shows a configuration of the timing generator of the present invention corresponding to one test channel (tester pin) for generating a test wave for a corresponding terminal pin of a device to be tested. In the example of FIG. 1, only a set pulse generator is shown in detail because a reset pulse generator has the same configuration as the set pulse generator. Also in the example of FIG. 1, the timing generator has a 4-phase interleave configuration although other number of phases are also feasible. The functional blocks identical to that of the conventional example of FIGS. 5 and 6 are denoted by the same reference numerals.

The embodiment of FIG. 1 includes a pattern generation block 500, a set pulse generator 310, a reset pulse generator 320 and a flip-flop 70. The pattern generation block 500 includes four pattern generators PG1–PG4. The set pulse generator 310 comprises a timing data generation block 100, a timing selector 200, a pulser 28, and a variable delay circuit 30b. The timing data generation block 100 includes four timing data generators TGD1–TGD4. The pattern generator PG1–PG4 produces, among others, timing information based on a test program to produce test waves to be supplied to the device under test. The pattern generators PG1–PG4 and the timing data generators TGD1–TGD4 have basically the same structures as that of the conventional example of FIG. 6 and are provided with a first test clock $T_{clk1}$.

The timing data selector 200 comprises a multiplexers (MUX) 21 and 22, a counter 23 and a flip-flop 25. The timing data selector 200 is provided with a second test clock $T_{clk2}$ which is four times higher in the frequency than the first test clock $T_{clk1}$. Namely, the second test clock $T_{clk2}$ has a frequency which is L times higher than the first test clock $T_{clk1}$ where L is the number of interleave phases.

In the set pulse generator 310, unlike the conventional example in which four variable delay circuits 29 are provided, only one variable delay circuit 30b is provided to produce the high resolution timings of the set pulse signal. The pulser 28 and the variable delay circuit 30b are provided with the second test clock $T_{clk2}$.

Each of the timing generators PG1–PG4 provides set pulse timing information to the corresponding one of the timing data generators TGD1–TGD4 in synchronism with the first test clock $T_{clk1}$. Upon receiving the set pulse timing information from the pattern generator PG1, the timing data generator TGD1 generates a coarse set signal G1 which is defined by an integer multiple of the first test clock $T_{clk1}$. The repetition rate of the coarse set signal G1 defines a test rate of the current test cycle in the test system. The timing data generator TGD1 also generates high resolution delay data HR1 having an M-bit width.

Similarly, based on the timing information from the pattern generator PG, the other timing data generators TGD2, TGD3 and TGD4 respectively produce set signals G2, G3 and G4 and high resolution delay data HR2, HR3 and HR4 as shown in FIG. 1. The coarse set signals G1–G4 are provided to the multiplexer 21 and the high resolution delay data HR1–HR4 are provided to the multiplexer 22. Each of the multiplexers 21 and 22 functions as a selector in which one of the selected inputs is produced at the output.

In FIG. 1, the multiplexer 21 is a 4-input-1-output type selector. Upon receiving the selection signal 23a from the counter 23, the multiplexer 21 selects and outputs one of the set signals G1–G4 specified by the selection signal 23a. The flip-flop 25 receives selected set signal and outputs a set signal G6 that is synchronized (re-timed) with the second test clock $T_{clk2}$ having a frequency four times higher than that of the first test clock $T_{clk1}$. Thus, at the output terminal of the flip-flop 25, the set signals are timing adjusted by the test clock $T_{clk2}$.

The multiplexer 22 comprises M channels of the 4-input-1-output type multiplexers to receive the high resolution delay data HR1–HR4. Each of the high resolution data is composed of M bits. Similar to the description regarding the multiplexer 21 above, the selection signal 23a is provided from the counter 23. Upon receiving the selection signal 23a, the multiplexer 22 selects one of the high resolution delay data HR1–HR4 at the output. The selected high resolution delay data HR5 is provided to the variable delay circuit 30b to define the fine delay time therein.

For example, the counter 23 is a 2-bit binary counter sufficient to specify any one of four phases in the interleave architecture. The counter 23 receives at its input terminal a set pulse signal SP1 from the output terminal of the variable delay circuit 30b for counting the number of pulses thereof. As in the foregoing, the set signals G1–G4 and the high resolution delay data HR1–HR4 from the timing data generators TGD1–TGD4 are consecutively selected by the operation of the multiplexers 21 and 22.

Upon receiving the set signal G6, the pulser 28 converts the set signal to a pulse signal P1 having a predetermined pulse width and is synchronized with the second test clock $T_{clk2}$. As a result, pulses are sequentially produced by the pulser 28 with the timing of the second test clock $T_{clk2}$, without interleave jitters. The high resolution delay time will be added to the pulses by the variable delay circuit 30b as described below.

Figure 2:
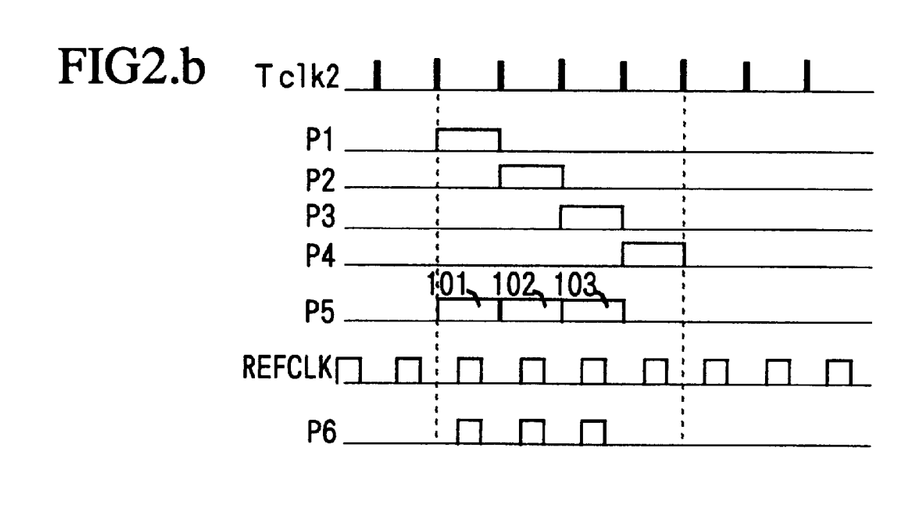
Figure 2A:
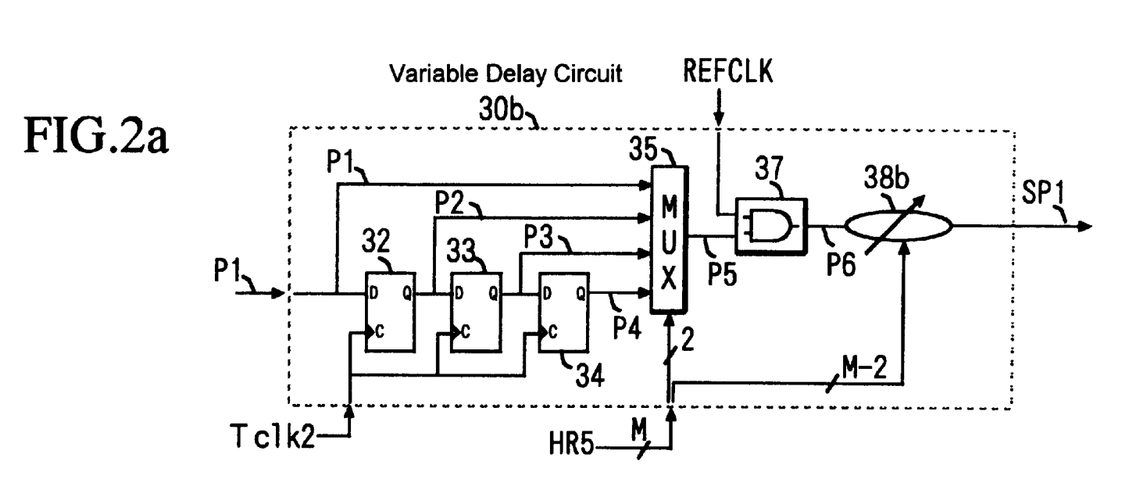

The variable delay circuit 30b in the present invention is configured differently from the variable delay circuit 29 in the conventional technology of FIG. 7a. As shown in FIG. 2a, the variable delay circuit 30b is comprised of flip-flops 32, 33 and 34, a multiplexer (MUX) 35, a gate circuit 37, and a variable fine delay circuit 38b.

The flip-flop 32, 33 and 34 and the multiplexer 35 play a role of producing a delay time which is an integer multiple of the second test $T_{clk2}$ such as 2 nS (nanosecond) increments. As shown in FIG. 2b, the series connected flip-flops 32–34 are provided with the second clock $T_{clk2}$ so that the pulse signals P1–P4 that are consecutively shifted by the second test clock $T_{clk2}$ are provided to the respective input terminals of the multiplexer 35. In this example, the upper 2 bits of the high resolution delay data HR5 is provided to the selection control input terminal of the multiplexer 35. In the case where the frequency of the tester rate has the maximum frequency that is equal to the frequency of the second test clock $T_{clk2}$, the high resolution delay data HR5 having an M-bit width is continuously provided at every cycle of the test clock $T_{clk2}$. Thus, the pulse signal P5 of FIG. 2b is produced continuously by the multiplexer 35.

Upon receiving the pulse signal P5 from the multiplexer 35, the gate circuit 37 provides a pulse signal P6 that is synchronized with the reference clock REFCLK to the variable fined delay circuit 38b. Although the use of the reference clock REFCLK is not essential in the present invention, it has a practical advantage to unify the timing of the signals by the high accuracy reference clock.

Since the larger part of the variable delay time is achieved by the flip-flops 32–34, the variable fine delay circuit 38b needs to have a small delay time which is less than one cycle of the second test clock $T_{clk2}$, which is in the foregoing example 2 nS (nanosecond). Upon receiving the pulse signal P6 from the gate circuit 37 and the lower bits (M-2) of the high resolution variable delay data HR5, the variable delay circuit 38b outputs the set pulse signal SP1 that is delayed by the delay time defined by the timing data from the pattern generator.

As in the foregoing, in the present invention, only one variable delay circuit is used in the timing generator of the four phase interleave architecture. Therefore, there is no interleave jitter caused by the fluctuations among the plurality of variable delay circuits as experienced in the conventional technology. In addition, an overall timing generator is actualized with low cost and small size because the large number of delay elements such as CMOS gates for the variable delay circuit can be obviated.

Moreover, in the foregoing example, the maximum delay time that has to be produced by the variable fine delay circuit 38b is one-fourth of the example of each of the variable delay circuit 29 in the conventional example of FIG. 6. Since the delay times by the variable delay elements such as CMOS gates are susceptible to temperature, the delay time change in the present invention is also reduced to one-fourth of the conventional example. In the same reason, phase jitters by other causes such as cross talk among pulse signals in the adjacent circuit components can also be reduced by the factor of four.

Figure 4A:
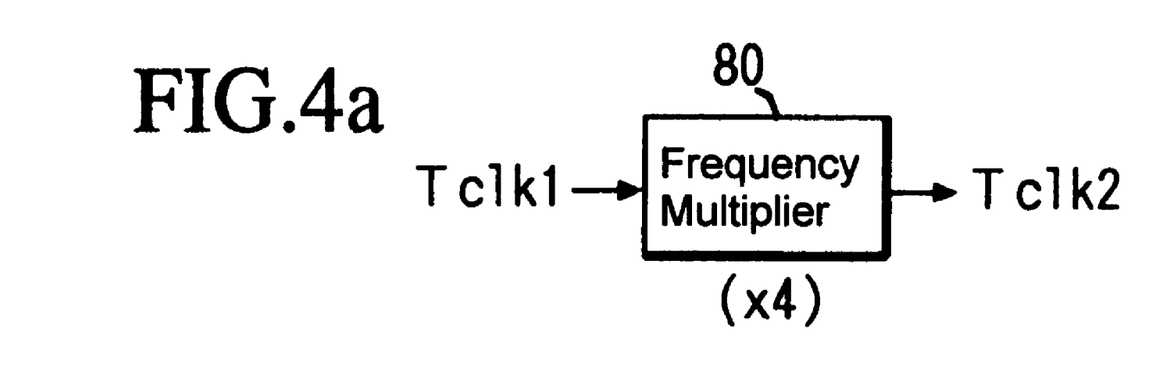
FIGS. 4a and 4b are schematic diagram showing examples of configuration for generating the test clocks to be used in the embodiments of FIGS. 1 and 8.
Figure 4B:
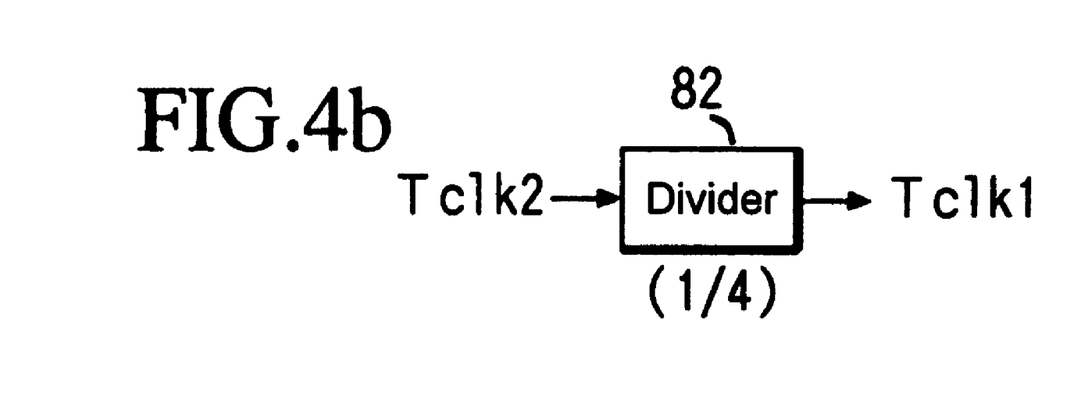

As shown in FIG. 4a, the second test clock $T_{clk2}$ can be produced by multiplying the first test clock $T_{clk1}$ by four times with a multiplier 80. Conversely, the first test clock $T_{clk1}$ can be produced by dividing the second test clock$_{clk2}$ by a divider 82 as shown in FIG. 4b.

The interleave operation of the present invention is further explained with reference to the timing chart of FIG. 3. In this example, it is assumed that the four phases (parallel circuit of timing data generator TGD1–TGD4) in the interleave structure are selected in the order from A, B, C to D in FIG. 3. One cycle time length of the first test clock $T_{clk1}$ is 8 nS (nanosecond) and one cycle time length of the second test clock $T_{clk2}$ is 2 nS.

In this example, the high resolution delay data HR1–HR4 show both the integer multiple of the test clock $T_{clk1}$ and the fraction of the test clock $T_{clk1}$. The high resolution delay time HR1 in FIG. 3A is "8 nS×0+2 nS×1+1 nS", the high resolution delay data HR2 in FIG. 3B is "8 nS×3+2 nS×0+0.5 nS", the high resolution delay data HR3 in FIG. 3C is "8 nS×2+2 nS×1+0.5 nS), and the high resolution delay data HR4 in FIG. 3D is "8 nS×1+2 nS×3+0 nS). Further, the second cycle of the high resolution delay data HR1 is "8 nS×1+2 nS×0+0 nS" as shown in FIG. 3A.

In the high resolution delay data HR1–HR4, the part showing the multiple of 8 nS is the delay time of the coarse set signal G1–G4 in the unit of test clock $T_{clk1}$ cycle. These coarse delays are achieved by the respective timing data generator TGD1–TGD4. Thus, the coarse set signals G1–G4 are generated by the timing shown by #1–#5 in FIG. 3. In the high resolution delay data HR1–HR4, the second part showing the multiple of 2 nS is the delay time expressed by the upper 2 bits of the delay data of FIG. 2a and is achieved by the flip-flops 32–34 in the unit of test clock $T_{clk2}$ cycle. The last part of the delay data which is smaller than 2 nS is a delay time expressed by the M-2 bits of FIG. 2a that is to be achieved by the variable fine delay circuit 38b.

Figure 3:
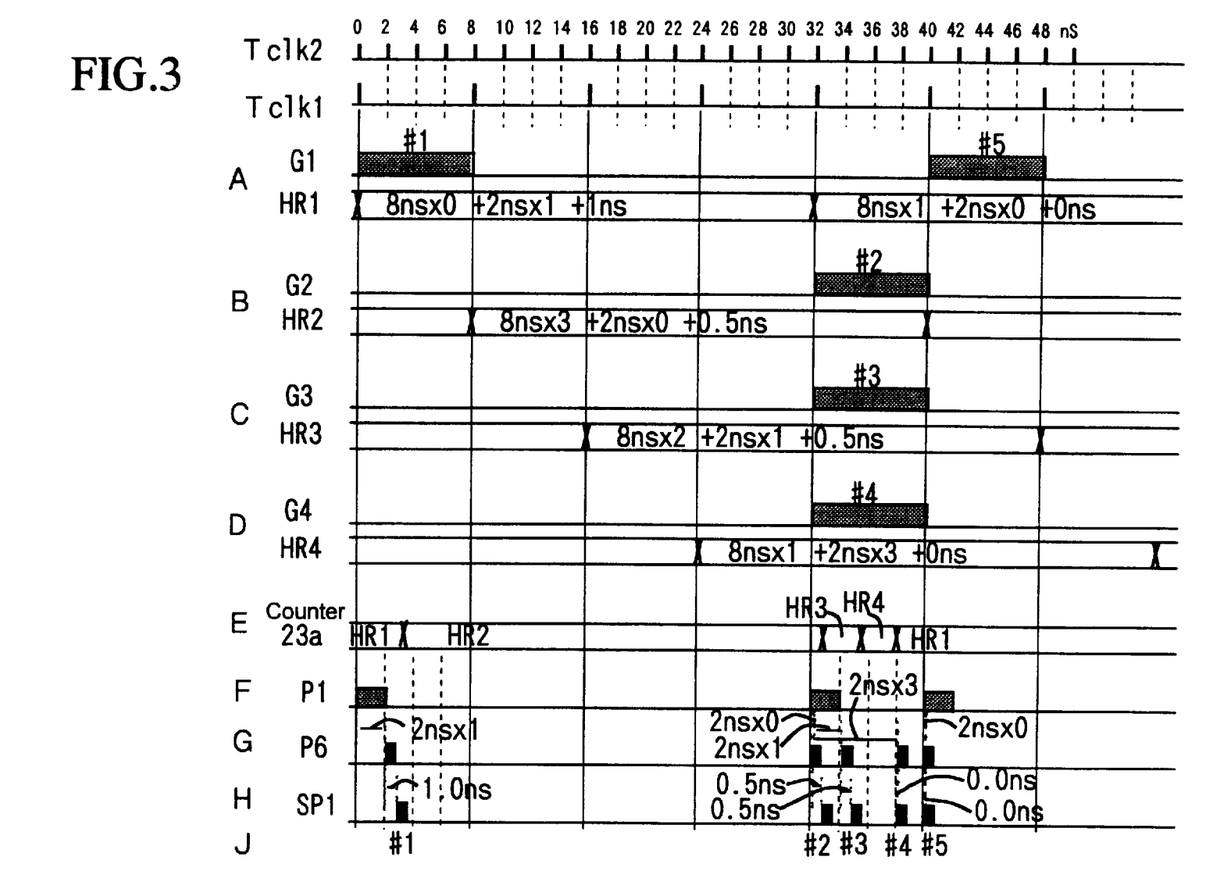

As shown in FIG. 3E, the selection signal 23a by the counter 23 selects the high resolution delay data in the order of HR1, HR2, HR3, HR4, and HR1. Based on the selected coarse set pulse, the pulser 28 provides the set pulse P1 of FIG. 3F to the variable delay circuit 30b. The flip-flops 32–34 and the multiplexer 35 provides the delay times by the unit of 2 nS to produce the set pulse P6 of FIG. 3G. The final set pulse SP1 of FIG. 3H is produced by adding a fine delay time which is smaller than the second test clock $T_{clk2}$ cycle by the fine delay circuit 38b.

As shown in the foregoing, the timing generator of high resolution timings is achieved by utilizing only one variable delay circuit 30b. In the prevent invention, the high resolution delay data HR1–HR4 produced in the parallel fashion are combined in the series fashion by the second clock which is faster than the first clock used in the parallel circuits. The combined delay data are received by the variable delay circuit 30b wherein the larger part of the fine delay time is produced by the logic circuits and the second clock. The smaller part of the fined delay time is produced by the fined delay circuit 38b.

Because there is no interleave operation in the variable delay circuits, the interleave jitter involved in the conventional technology when interleaving the variable delay circuits is no longer occurred in the present invention. Further, since only one variable delay circuit is employed, the circuit components and the circuit size can be substantially decreased.

The configuration of the present invention is not limited to the embodiment described above. For example, the number of interleave phase (L) can be set as desired number which is larger than 2 while the associated circuits are arranged to meet the number of phases, such as the frequency relationship between the clocks. The variable delay circuit 38b can be replaced with the delay circuit of FIG. 7a. The flip-flops in FIG. 2a can be replaced with shift registers.

Figure 8:
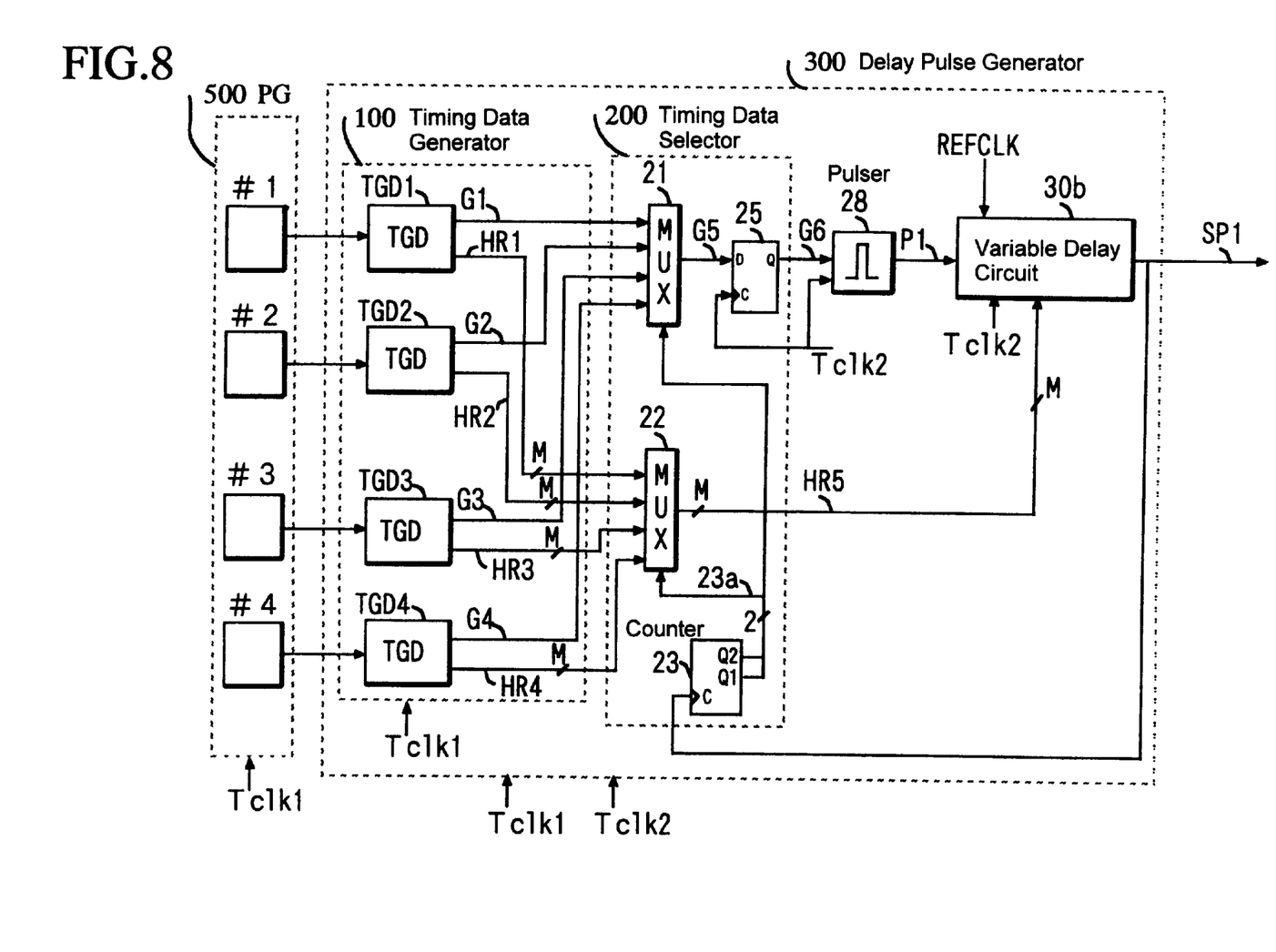
FIG. 8 is a block diagram showing another embodiment of the present invention which is incorporated in a delay timing generator having a four-phase interleave architecture.

The present invention can be applied to other part of the semiconductor test system. FIG. 8 shows a delay pulse generator 300 which can be used in a semiconductor test system or other applications. The delay pulse generator 300 produces pulse signals having high resolution delay times defined by delay data by the interleave operation. Such delay data includes an integral part which shows a delay time of an integer multiple of the clock signal and a fractional part which shows a delay time smaller than one cycle time of the clock signal.

As described in the foregoing, according to the present invention, since there is no interleave operation in the variable delay circuits, the interleave jitter involved in the conventional technology when interleaving pulse signals in the variable delay circuits is no longer occurred. Further, since only one variable delay circuit is employed, the circuit components and the circuit size can be substantially decreased. Moreover, since the variable delay circuit is assigned to the high resolution delay time which is smaller than that of the conventional example, the delay time fluctuation by the temperature change is also substantially reduced.

For example, as to the circuit components, the timing generator in the four phase interleave structure in the above example needs only one-fourth of the conventional variable delay circuits. Further, since the variable delay circuit is assigned to the high resolution delay time which is smaller that of the conventional example, the circuit components in the variable delay circuit can also be reduced. Thus, an overall size of the variable delay circuit 30b of the present invention can be decreased to 1/16 compared to that of the conventional example.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A timing generator to be used in a semiconductor test system for testing a semiconductor device, comprising:

a plurality of timing data generators arranged in a parallel fashion and provided with a first clock signal, each of the timing data generator producing a coarse timing signal and a delay time data based on timing data provided by a test program;

multiplexing means provided with a second clock signal having a frequency higher than the first clock signal for receiving the coarse timing signals and delay data in parallel and produces selected one of coarse timing signal and the delay data in series; and a variable delay circuit which receives the coarse timing signal and the delay data from the multiplexing means for providing a delay time defined by the delay data to the coarse timing signal.

2. A timing generator as defined in claim 1, further comprising a selection signal generator for providing a selection signal to the multiplexing means to control the selection operation thereof.

3. A timing generator as defined in claim 1, further comprising a pulser for producing a pulse signal having a predetermined pulse width upon receiving the coarse timing signal from the multiplexing means.

4. A timing generator as defined in claim 1, wherein said multiplexing means is comprised of a first multiplexer for selecting one of the coarse timing signals received from the plurality of timing data generator and a second multiplexer for selecting one of the delay data received from the plurality of timing data generators.

5. A timing generator as defined in claim 4, further comprising a flip-flop circuit which receives the selected coarse timing signal from the first multiplexer and latches the coarse timing signal in synchronism with the second clock signal.

6. A timing generator as defined in claim 1, wherein the second clock signal has a frequency higher than the frequency of the first clock signal by the number of times equal to the number of timing data generators provided in the parallel fashion.

7. A timing generator as defined in claim 1, wherein said variable delay circuit is comprised of:

a logic delay circuit for delaying the coarse timing signal by an integer multiple of one cycle length of the second clock signal; and an analog delay circuit connected in series with the logic delay circuit for delaying the coarse timing signal by a time length which is a fraction of one cycle length of the second clock signal based on the delay data received from the multiplexing means.

8. A timing generator as defined in claim 7, wherein the logic delay circuit is formed with series connected flip-flop circuits and a multiplexer which receives outputs of the flip-flop circuits and selects one of the outputs, and the analog delay circuit is formed with a plurality of CMOS gates series connected with one another.

9. A timing generator as defined in claim 2, wherein the selection signal generator is a counter which increments upon receiving an output pulse having a specified delay time from the variable delay circuit.

10. A semiconductor test system for testing a semiconductor device by supplying test signals with predetermined timings to a semiconductor device under test (DUT), comprising:

a pattern generator for generating a test pattern signal and timing information of the test pattern signal based on a test program;

a set pulse generator for generating a set pulse which defines a rising edge of the test pattern signal to be supplied to the DUT;

a reset pulse generator for generating a reset pulse which defines a falling edge of the test pattern signal to be supplied to the DUT;

a flip-flop circuit for producing the test pattern signal having the rising edge defined by the set pulse from the set pulse generator and the falling edge defined by the reset pulse from the reset pulse generator;

wherein each of the set pulse generator and the reset pulse generator comprising:

a plurality of timing data generators arranged in a parallel fashion and provided with a first clock signal, each of the timing data generator producing a coarse timing signal and a delay time data based on the timing information provided by the test program;

multiplexing means provided with a second clock signal having a frequency higher than the first clock signal for receiving the coarse timing signals and delay data in parallel and produces selected one of coarse timing signal and the delay data in series; and a variable delay circuit which receives the coarse timing signal and the delay data from the multiplexing means for providing a delay time defined by the delay data to the coarse timing signal.

11. A semiconductor test system as defined in claim 10, further comprising a driver for receiving the test pattern signal from the flip-flop circuit and supplying the test pattern signal to the DUT with a predetermined amplitude and waveform.

12. A semiconductor test system as defined in claim 10, each of the set pulse generator and the reset pulse generator further comprising a selection signal generator for providing a selection signal to the multiplexing means to control the selection operation thereof.

13. A semiconductor test system as defined in claim 10, wherein said multiplexing means is comprised of a first multiplexer for selecting one of the coarse timing signals received from the plurality of timing data generator and a second multiplexer for selecting one of the delay data received from the plurality of timing data generators.

14. A semiconductor test system as defined in claim 10, each of the set pulse generator and the resent pulse generator further comprising a flip-flop circuit which receives the selected coarse timing signal from the first multiplexer and latches the coarse timing signal in synchronism with the second clock signal.

15. A semiconductor test system as defined in claim 10, wherein the second clock signal has a frequency higher than the frequency of the first clock signal by the number of times equal to the number of timing data generators provided in the parallel fashion.

16. A semiconductor test system as defined in claim 10, wherein said variable delay circuit in each of the set pulse generator and the reset pulse generator is comprised of:

a logic delay circuit for delaying the coarse timing signal by an integer multiple of one cycle length of the second clock signal; and an analog delay circuit connected in series with the logic delay circuit for delaying the coarse timing signal by a time length which is a fraction of one cycle length of the second clock signal based on the delay data received from the multiplexing means.

17. A semiconductor test system as defined in claim 16, wherein the logic delay circuit is formed with series connected flip-flop circuits and a multiplexer which receives outputs of the flip-flop circuits and selects one of the outputs, and the analog delay circuit is formed with a plurality of CMOS gates series connected with one another.

18. A semiconductor test system as defined in claim 12, wherein the selection signal generator is a counter which increments upon receiving an output pulse having a specified delay time from the variable delay circuit.

19. A semiconductor test system as defined in claim 10, wherein the pattern generator is formed with a plurality of pattern generator blocks each of which corresponds to the timing data generator in the set pulse generator and the resent pulse generator to provide the timing information thereto.

20. A semiconductor test system as defined in claim 10, wherein the number of timing data generators arranged in parallel in each of the set pulse generator and the resent pulse generator is four, and the frequency of the second clock signal is four times higher than that of the first clock signal.

* * * * *